US012596480B2

(12) United States Patent
Nandanwar et al.

(10) Patent No.: US 12,596,480 B2
(45) Date of Patent: Apr. 7, 2026

---

(54) BANK-BASED REFRESH FOR A MEMORY DEVICE

(71) Applicant: QUALCOMM Incorporated, San Diego, CA (US)

(72) Inventors: Darshan Kumar Nandanwar, Bangalore (IN); Ankit Gosalia, Milpitas, CA (US); Swayamsampanna Padhi, Jajpur (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 18/896,255

(22) Filed: Sep. 25, 2024

(65) Prior Publication Data
US 2026/0086716 A1     Mar. 26, 2026

(51) Int. Cl.
*G06F 3/06* (2006.01)
*G11C 11/406* (2006.01)

(52) U.S. Cl.
CPC ............ *G06F 3/061* (2013.01); *G06F 3/0653* (2013.01); *G06F 3/0673* (2013.01); *G11C 11/406* (2013.01)

(58) Field of Classification Search
CPC .... G06F 3/0619; G06F 3/0634; G06F 3/0647; G06F 3/0673
See application file for complete search history.

(56) References Cited

U.S. PATENT DOCUMENTS

2011/0205826 A1* 8/2011 Kuroda ............ G11C 11/40626
                                                      365/222
2016/0155491 A1* 6/2016 Roberts ............ G11C 11/40607
                                                      711/106
2017/0255403 A1* 9/2017 Sharon .................... G06F 3/064
2020/0042197 A1* 2/2020 Kotra .................... G06F 3/0647
2020/0402569 A1* 12/2020 He .................... G11C 11/40626
2021/0034256 A1* 2/2021 Kotra ........................ G11C 7/04
2024/0203477 A1* 6/2024 Jung ................. G11C 11/40611

OTHER PUBLICATIONS

Micron Technology, Inc: "256Mb: ×4, ×8, ×16 SDRAM", MT48LC64M4A2—16 Meg×4×4 Banks, MT48LC32M8A2—8 Meg×8×4 Banks, MT48LC16M16A2—4 Meg×16×4 Banks, Nov. 7, 2018, pp. 1-94.
Guan M., et al., "Temperature Aware Refresh for DRAM Performance Improvement in 3D ICs", Sixteenth International Symposium on Quality Electronic Design, IEEE, Mar. 2, 2015, pp. 207-211, XP032763960, DOI: 10.1109/ISQED.2015.7085426.
International Search Report and Written Opinion PCT/US2025/041810 ISA/EPO Dec. 5, 2025.

* cited by examiner

*Primary Examiner* — Yong J Choe
(74) *Attorney, Agent, or Firm* — NORTON ROSE FULBRIGHT US LLP

(57) ABSTRACT

An apparatus includes a memory controller configured to receive, from a three-dimensional (3D) memory device, first temperature information associated with a first bank of the 3D memory device and to receive, from the 3D memory device, second temperature information associated with a second bank of the 3D memory device. The first bank and the second bank are associated with a common rank of the 3D memory device. The memory controller is further configured to provide, to the 3D memory device, a first refresh command associated with the first bank and to provide, to the 3D memory device, a second refresh command associated with the second bank. The first refresh command is associated with a first refresh interval that is different than a second refresh interval associated with the second refresh command.

18 Claims, 5 Drawing Sheets

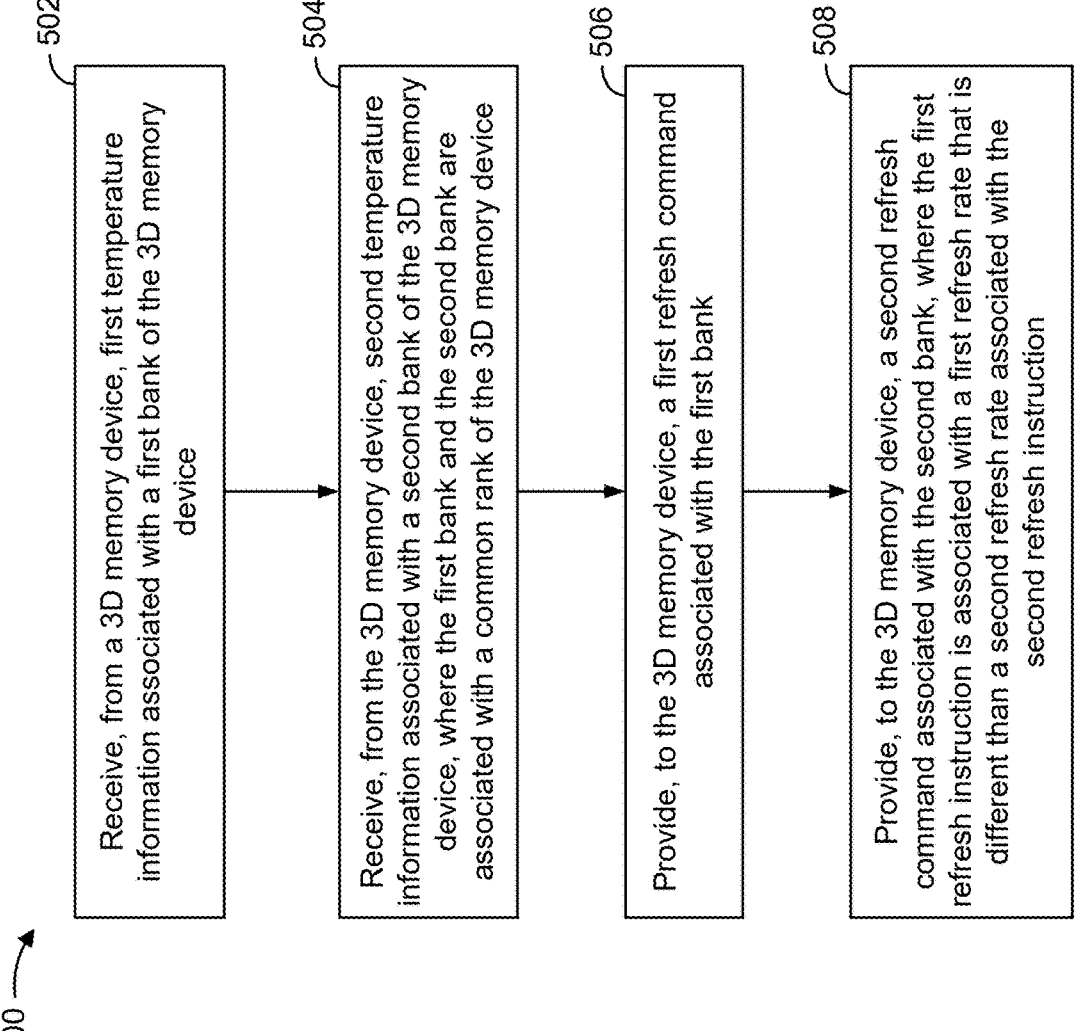

502 Receive, from a 3D memory device, first temperature information associated with a first bank of the 3D memory device 504 Receive, from the 3D memory device, second temperature information associated with a second bank of the 3D memory device, where the first bank and the second bank are associated with a common rank of the 3D memory device 506 Provide, to the 3D memory device, a first refresh command associated with the first bank 508 Provide, to the 3D memory device, a second refresh command associated with the second bank, where the first refresh instruction is associated with a first refresh rate that is different than a second refresh rate associated with the second refresh instruction

BANK-BASED REFRESH FOR A MEMORY DEVICE

TECHNICAL FIELD

Aspects of the present disclosure relate generally to computer information systems, and more particularly, to refresh operations for memory systems.

DESCRIPTION OF THE RELATED TECHNOLOGY

A computing device (e.g., a laptop, a mobile phone, etc.) may include one or several processors to perform various computing functions, such as telephony, wireless data access, and camera/video function, etc. A memory system is an important component of the computing device. The processors may be coupled to the memory system to perform the aforementioned computing functions. For example, the processors may fetch instructions from the memory system to perform the computing functions and/or to store within the memory system temporary data involved in performing these computing functions.

Memory systems may make use of memory cells that are volatile. Volatile memory cells retain information for short periods of time, such as fractions of a second. A refresh operation may be performed with volatile memory cells to maintain the information for longer periods of time. In an example volatile memory cell storing information as an electrical charge, the electrical charge decays over a fraction of a second. Before the charge decays beyond the point of lost information, the memory cell may be refreshed to extend the period of time that the memory cell retains the information. In some cases the refresh may be repeatedly performed to extend the period of storage of the information indefinitely, or as long as electricity is supplied to the circuit. This refresh operation consumes power, which impacts the operation of devices operating from limited power sources, such as with mobile devices operating from battery power.

BRIEF SUMMARY OF SOME EXAMPLES

The systems, methods and devices of this disclosure each have several innovative aspects, no single one of which is solely responsible for the desirable attributes disclosed herein.

In at least one aspect, an apparatus includes a memory controller configured to receive, from a three-dimensional (3D) memory device, first temperature information associated with a first bank of the 3D memory device and to receive, from the 3D memory device, second temperature information associated with a second bank of the 3D memory device. The first bank and the second bank are associated with a common rank of the 3D memory device. The memory controller is further configured to provide, to the 3D memory device, a first refresh command associated with the first bank and to provide, to the 3D memory device, a second refresh command associated with the second bank. The first refresh command is associated with a first refresh interval that is different than a second refresh interval associated with the second refresh command.

In another aspect, a method of operation of a memory controller includes receiving, from a three-dimensional (3D) memory device, first temperature information associated with a first bank of the 3D memory device and further includes receiving, from the 3D memory device, second temperature information associated with a second bank of the 3D memory device. The first bank and the second bank are associated with a common rank of the 3D memory device. The method further includes providing, to the 3D memory device, a first refresh command associated with the first bank and also includes providing, to the 3D memory device, a second refresh command associated with the second bank. The first refresh command is associated with a first refresh interval that is different than a second refresh interval associated with the second refresh command.

In another aspect, a non-transitory computer-readable medium stores instructions executable by one or more processors of a memory controller to initiate, perform, or control operations. The operations include receiving, from a three-dimensional (3D) memory device, first temperature information associated with a first bank of the 3D memory device and receiving, from the 3D memory device, second temperature information associated with a second bank of the 3D memory device. The first bank and the second bank are associated with a common rank of the 3D memory device. The operations further include providing, to the 3D memory device, a first refresh command associated with the first bank and providing, to the 3D memory device, a second refresh command associated with the second bank. The first refresh command is associated with a first refresh interval that is different than a second refresh interval associated with the second refresh command.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, aspects and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described aspects. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

BRIEF DESCRIPTION OF THE DRAWINGS

FIG. 5 is a flow diagram illustrating an example of a method that supports bank-based memory refresh operations.

Like reference numbers and designations in the various drawings indicate like elements.

DETAILED DESCRIPTION

Figure 1:
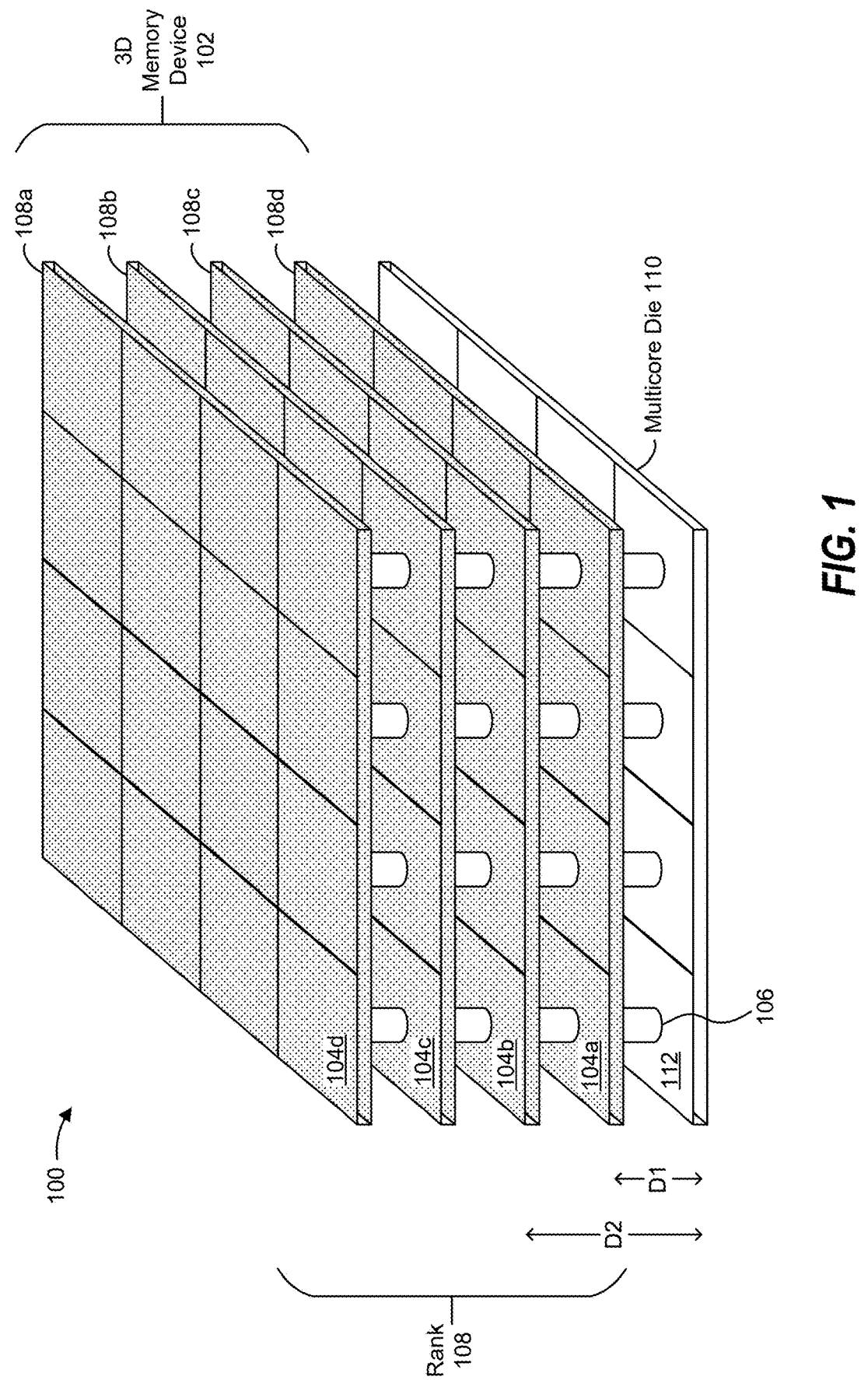
FIG. 1 illustrates an example of a system that supports bank-based memory refresh operations.

Some memory devices may measure temperature and may adjust a refresh rate based on the measured temperature. For example, a memory device may have a first mode (such as a default mode) that uses a first refresh rate and a second mode (such as a high temperature mode) that uses a second refresh rate if a high temperature is detected at the memory device. The second refresh rate may be greater than the first refresh rate to reduce or avoid errors in stored data that may result from the high temperature.

Such a refresh scheme may be relatively efficient in some scenarios, such as where temperatures are relatively stable. In some other scenarios, such a refresh scheme may be less efficient. For example, in some memory designs, some areas of a memory device may experience dissimilar temperatures as compared to other areas of the memory device. As a result, the design of the memory device may need to be selected to be either "conservative" (e.g., where a relatively low increase in temperature may trigger a change from the first mode to the second mode) or "aggressive" (e.g., where a greater increase in temperature triggers the change from the first mode to the second mode). A conservative approach may increase power consumption, while an aggressive approach may risk data loss due to errors in stored data that may result from the high temperature.

In accordance with some aspects of the disclosure, a three-dimensional (3D) memory device may include a rank of memory banks each disposed a different physical distance from a controller tile associated with the rank. Due to the different physical distances of the rank of the memory banks, each memory bank may experience a different temperature or range of temperatures (e.g., where heat from operation of the controller tile has a greater effect on memory banks that are physically closer to the controller tile as compared to memory banks that are physically farther from the controller tile). In some aspects, refresh operations may be performed for the memory banks individually (or on a "per bank" basis) in accordance with such different temperatures for different memory banks.

To illustrate, in some examples, a memory controller associated with the 3D memory device may include a set of counters. Each counter of the set of counters may be associated with a respective memory bank of the 3D memory device. Further, values of the counters may be set based on individual temperatures measured at the different memory banks of the 3D memory device. Upon expiration of a counter, the corresponding memory bank may be refreshed. For example, in some implementations, a first memory bank nearer to the memory tile may be refreshed more frequently (or may be more likely to be refreshed more frequently) as compared to a second memory bank is farther from the memory tile. The first memory bank and the second memory bank may be included in a common rank. In some examples, performing a refresh of the first memory bank may include gating off (or masking, or "blocking") refresh operations to other memory banks of the rank, such as the second memory bank.

One or more features described herein may improve performance associated with a memory device. For example, enabling individual refresh operations on a per-bank basis may enable improved temperature control of memory banks with greater temperature (such as memory banks closer to a controller tile) without involving excessive or unnecessary refresh operations to memory banks with lower temperatures (such as memory banks further from the controller tile). As a result, performance may be improved as compared to some "conservative" techniques (which may increase power consumption by increasing the refresh rate for memory banks with relatively low temperatures) and also as compared to some "aggressive" techniques (which may risk data loss by allowing greater temperatures at memory banks before increasing the refresh rate of the memory banks).

FIG. 1 illustrates an example of a system 100 that supports bank-based memory refresh operations. The system 100 may include a memory device, such as a three-dimensional (3D) memory device 102. The system 100 may further include a multicore die 110 coupled to the 3D memory device 102.

In some implementations, the 3D memory device 102 may correspond to a multi-die (e.g., stacked die) 3D memory device that includes multiple memory dies. For example, 3D memory device 102 may include a first memory die 108a, a second memory die 108b, a third memory die 108c, and a fourth memory die 108d. Although the example of FIG. 1 may illustrate four such memory dies, in other examples, the 3D memory device 102 may include a different quantity of memory dies. To illustrate, in some implementations, the 3D memory device 102 may include two memory dies, three memory dies, eight memory dies, or another quantity of memory dies. In some other examples, the 3D memory device 102 may correspond to a single-die 3D memory device, such as a monolithic single-die 3D memory device.

The 3D memory device 102 may include multiple ranks, and each such rank may include multiple banks. To illustrate, the 3D memory device 102 may include a representative rank 108. The rank 108 may include a first bank 104a, a second bank 104b, a third bank 104c, and a fourth bank 104d. Accordingly, the banks 104a-d may be associated with a common rank (the rank 108). Although the example of FIG. 1 may illustrate sixteen such ranks, in other examples, the 3D memory device 102 may include a different quantity of ranks. To illustrate, in some implementations, the 3D memory device 102 may include two ranks, three ranks, eight ranks, or another quantity of ranks.

Further, a rank may be associated with one or more respective through-silicon vias (TSVs). For example, the rank 108 may be associated with a TSV 106. The TSV 106 may be coupled to the banks 104a-d. Although the example of FIG. 1 may illustrate one such TSV 106, it should be appreciated that a rank may be associated with multiple TSVs.

In some examples, the multicore die 110 may include a set of controller tiles associated with respective ranks of the 3D memory device 102. For example, the multicore die 110 may include a representative controller tile 112. The controller tile 112 may be coupled to the TSV 106. Further, the controller tile 112 may be coupled to the banks 104a-d via a set of TSVs, which may include the TSV 106.

In some implementations, the 3D memory device 102 may include or may correspond to a volatile memory, such as a dynamic random access memory (DRAM). Other examples are also within the scope of the disclosure. For example, in some other implementations, the 3D memory device 102 may include or may correspond to a static random access memory (SRAM) or a hybrid memory, as illustrative examples. In some examples, the system 100 may correspond to or may be implemented as system-in-package (SiP) device. Further, in some examples, the multicore die 110 may correspond to a system-on-chip (SoC) device or another integrated circuit.

In some implementations, different banks within a rank (such as the rank 108) may be associated with different physical distances from the controller tile 112, which may result in different temperatures associated with the different banks. To illustrate, the first bank 104a may be associated with a first physical distance D1 from the controller tile 112, and the second bank 104b may be associated with a second physical distance D2 from the controller tile 112, where the second physical distance D2 is different than (e.g., less than) the first physical distance D1. In some such examples, a first refresh interval associated with the first bank 104a may be less than a second refresh interval associated with the second bank 104b, as described further below.

Figure 2:
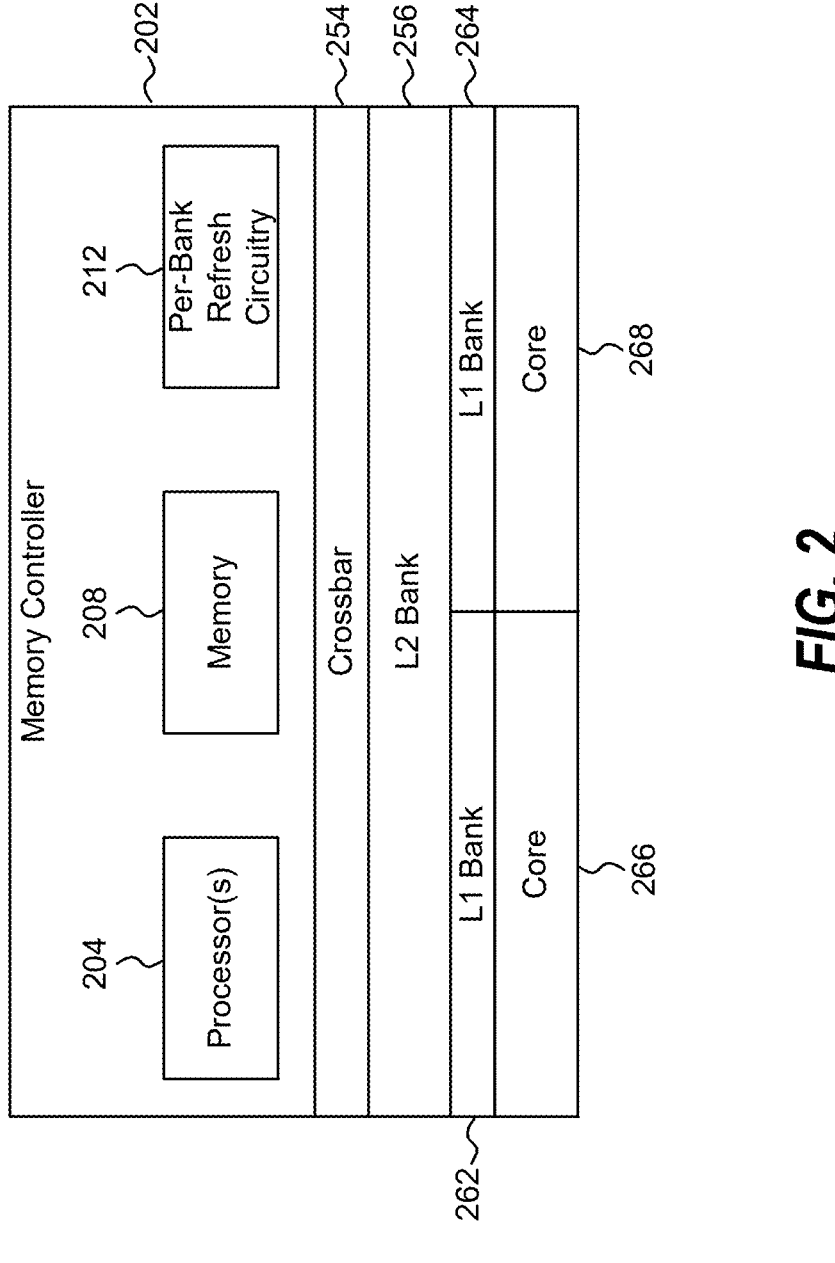
FIG. 2 illustrates an example of a controller tile that supports bank-based memory refresh operations.

FIG. 2 illustrates an example of a controller tile 112 that supports bank-based memory refresh operations. The controller tile 112 may include a memory controller 202, a cross bar 254, a level-two (L2) bank 256, a level-one (L1) bank 262, an L1 bank 264, a core 266, and a core 268. In some examples, the memory controller 202 may include one or more processors 204, a memory 208, and per-bank refresh circuitry 212.

During operation, the memory controller 202 may control operations associated with a particular rank of the 3D memory device 102 of FIG. 1. For example, in some implementations, the one or more processors 204 may initiate, perform, or control one or more operations described herein, such as by executing instructions retrieved from the memory 208. In some examples, the memory controller 202 may use the per-bank refresh circuitry 212 to control refresh operations associated with the rank 108 of FIG. 1. Some illustrative examples that may be associated with the per-bank refresh circuitry 212 are described further with reference to FIG. 3.

Figure 3:
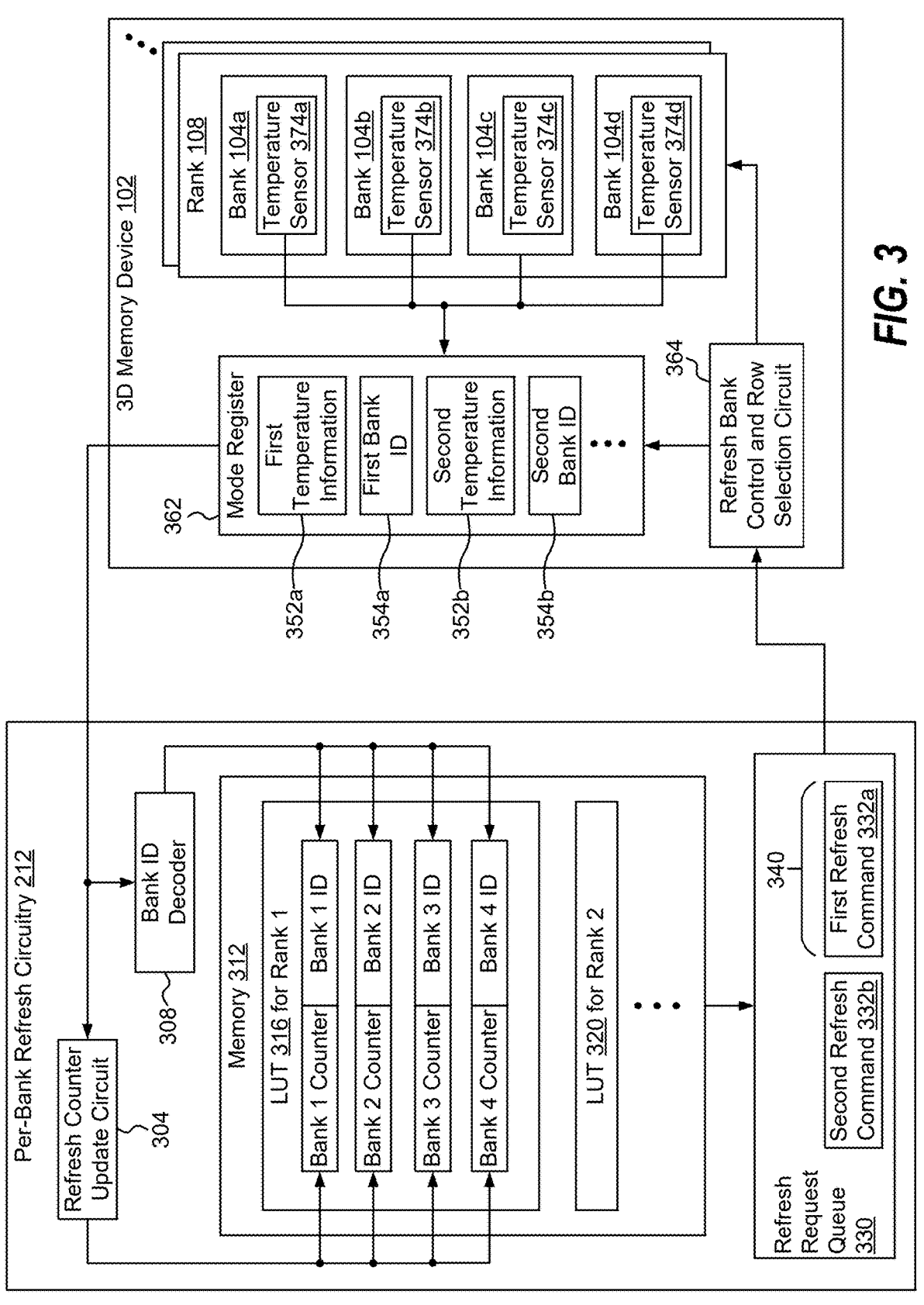
FIG. 3 illustrates examples of per-bank refresh circuitry and a three-dimensional (3D) memory device that support bank-based memory refresh operations.

FIG. 3 illustrates examples of per-bank refresh circuitry 212 and a 3D memory device 102 that support bank-based memory refresh operations. In the example of FIG. 3, the per-bank refresh circuitry 212 may include a refresh counter update circuit 304, a bank identifier (ID) decoder 308, a memory 312, and a refresh request queue 330. The refresh counter update circuit 304 and the bank ID decoder 308 may be coupled to the memory 312. The memory 312 may be coupled to the refresh request queue 330.

The 3D memory device 102 may include ranks of storage elements, such as the rank 108. The rank 108 may include the banks 104a-d. Further, the banks 104a-d may include temperature sensors 374a, 374b, 374c, and 374d. In some examples, the temperature sensors 374a-d may include junction temperature (Tj) sensors, as an illustrative example. In some examples, the temperature sensors 374a-d may be positioned near a center of the banks 104a-d, respectively, or at another location of the banks 104a-d, respectively.

The 3D memory device 102 may also include a mode register 362 coupled to temperature sensors of ranks of the 3D memory device 102, such as the temperature sensors 374c-d of the rank 108. The 3D memory device 102 may also include a refresh bank control and row selection circuit 364. The refresh bank control and row selection circuit 364 may be coupled to the mode register 362.

The 3D memory device 102 may be coupled to the per-bank refresh circuitry 212. For example, the refresh bank control and row selection circuit 364 may be coupled to the refresh request queue 330. As another example, the mode register 362 may be coupled to the refresh counter update circuit 304 and to the bank ID decoder 308. In some examples, the 3D memory device 102 may be coupled to the per-bank refresh circuitry 212 using one or more busses, interfaces, TSVs (e.g., the TSV 106 of FIG. 1), one or more other structures, or a combination thereof.

The memory 312 may be configured to store lookup tables (LUTs) associated with ranks of the 3D memory device 102. For example, the memory 312 may be configured to store an LUT 316 associated with the rank 108 and may include an LUT 320 associated with another rank of the 3D memory device 102. The LUT 316 may include or may be associated with, for each bank of the rank 108, a counter associated with the bank and an ID associated with the bank, as described further below. In some examples, such counters (e.g., "bank 1 counter," "bank 2 counter," "bank 3 counter," and "bank 4 counter") may include or may be referred to as a counter stack. The counter stack may be coupled to the bank ID decoder 308 to the refresh counter update circuit 304.

During operation, ranks of the 3D memory device 102 may perform temperature measurements on a per-bank basis and may provide the temperature measurements to the mode register 362. For example, the temperature sensor 374a may determine first temperature information 352a associated with the first bank 104a and may provide the first temperature information 352a to the mode register 362. As another example, the temperature sensor 374b may determine second temperature information 352b associated with the second bank 104b and may provide the second temperature information 352b to the mode register 362. Similarly, the temperature sensors 374c-d may provide, to the mode register 362, temperature information associated with the banks 104c-d, respectively. Further, although the example of FIG. 3 may illustrate a single rank 108 for illustration, the mode register 362 may receive temperature information from multiple ranks of the 3D memory device 102 on a per-bank basis.

In some implementations, temperature information may include a measured temperature or a recommended temperature. To illustrate, in some examples, the first temperature information 352a may indicate, for example, a temperature measured at the first bank 104a or a temperature range associated with the first bank 104a. In some other implementations, a bank may provide temperature information to the mode register 362 to recommend an adjusted temperature setting. As an illustrative example, as temperature increases at the first bank 104a (e.g., as measured by the temperature sensor 374a), the first bank 104a may decrease the recommended temperature setting via the first temperature information 352a.

To further illustrate, in some examples, different banks of the rank 108 may be associated with different temperatures, such as due to different physical distances from a heat source. Referring again to FIG. 1, in some examples, the heat source may correspond to the controller tile 112. A bank more proximate to the heat source (such as the first bank 104a) may experience more heat than a bank less proximate to the heat source (such as the fourth bank 104d). As a result, in some scenarios, the first bank 104a may measure greater temperatures and may recommend more "aggressive" heat dissipation as compared to the fourth bank 104d.

Referring again to FIG. 3, the mode register 362 may store the temperature information from banks of the 3D memory device 102, such as the temperature information 352a-b. In some implementations, the mode register 362 may store IDs associated with the banks. For example, the mode register 362 may store a first bank ID 354a associated with the first bank 104a to indicate that the first temperature information 352a is associated with the first bank 104a. As another example, the mode register 362 may store a second bank ID 354b associated with the second bank 104b to indicate that the second temperature information 352b is associated with the second bank 104b.

The per-bank refresh circuitry 212 may receive temperature information and bank IDs associated with the temperature information from the 3D memory device 102. For example, the per-bank refresh circuitry 212 may receive the temperature information 352a-b and the bank IDs 354a-b from the mode register 362. In some examples, the per-bank refresh circuitry 212 may input the temperature information 352a-b to the refresh counter update circuit 304 and may input the bank IDs 354a-b to the bank ID decoder 308.

In some implementations, the bank ID decoder 308 may receive bank IDs from the mode register 362 and may perform decoding associated with bank IDs received from the 3D memory device 102. For example, the bank ID decoder 308 may receive the first bank ID 354a and may decode the first bank ID 354a to determine a first row of the LUT 316 (e.g., a particular row associated with the first bank 104a). As another example, the bank ID decoder 308 may receive the second bank ID 354b and may decode the second bank ID 354b to determine a second row of the LUT 316 associated with the second bank 104b (e.g., a particular row associated with the second bank 104b).

The bank ID decoder 308 may provide a selection signal (or an enable signal) to the memory 312 in accordance with a decoded bank ID. For example, the bank ID decoder 308 may select (or may enable) a first counter ("bank 1 counter") associated with the first bank 104a based on decoding the first bank ID 354a. As another example, the bank ID decoder 308 may select (or may enable) a second counter ("bank 2 counter") associated with the second bank 104b based on decoding the second bank ID 354b.

The refresh counter update circuit 304 may receive temperature information from the mode register 362. In some examples, the refresh counter update circuit 304 may determine, based on the temperature information, refresh intervals for the 3D memory device 102 on a per-bank basis. To illustrate, in some examples, the first temperature information 352a-b may indicate that the first bank 104a is associated with a greater temperature as compared to the second bank 104b (e.g., due to proximity of the first bank 104a to the controller tile 112 of FIG. 1). Accordingly, in some implementations, the refresh counter update circuit 304 may assign a smaller refresh interval to the first bank 104a as compared to the second bank 104b. An example of a refresh interval is refresh interval time (tREFI), which may correspond to a recommended or maximum interval between refresh operations at a particular bank of 3D memory device 102.

The refresh counter update circuit 304 may update counters stored at the memory 312 based on the temperature information and further based on bank IDs decoded by the bank ID decoder 308. For example, the refresh counter update circuit 304 may adjust a first value of the first counter ("bank 1 counter") based on the first temperature information 352a and further based on the first bank ID 354a ("bank 1 ID") decoded by the bank ID decoder 308. As another example, the refresh counter update circuit 304 may adjust a second value of the second counter ("bank 2 counter") based on the second temperature information 352b and further based on the second bank ID 354b ("bank 2 ID") decoded by the bank ID decoder 308.

By updating counters at the memory 312, the per-bank refresh circuitry 212 may adjust refresh times associated the 3D memory device 102 on a per-bank basis. Further, different banks of the 3D memory device 102 may be refreshed at different intervals based on different temperatures associated with the banks. To further illustrate, in some examples, the per-bank refresh circuitry 212 may operate in accordance with a temperature setting table. Table 1 (below) illustrates an example of such a temperature setting table:

TABLE 1

| Example Temperature Range | Input to Mode Register Sense Register | Output of Mode Register | | Example Refresh Interval |
|---|---|---|---|---|
| | | First Bit of Mode Register | Second Bit of Mode Register | |
| 0° C.-44° C. | 000_0000 to 010_1100 | 0 | 0 | 7.8 μs |
| 45° C.-84° C. | 010_1101 to 101_0100 | 0 | 1 | 5.8 μs |
| 85° C.-94° C. | 101_0101 to 101_1110 | 1 | 0 | 3.9 μs |
| 95° C.-105° C. | 101_1111 to 110_1001 | 1 | 1 | 1.9 μs |

In the example of Table 1, "example temperature range" may correspond to a range of temperatures measured or recommended by a temperature sensor, such as one of the temperature sensors 374a. In some examples, "sense register" may correspond to values indicated by sense registers of banks of the 3D memory device 102, where the mode register 362 is coupled to the sense registers. Based on a values indicated by a sense register, the mode register 362 may store a multi-bit value including a first bit ("first bit of mode register") and a second bit ("second bit of mode register"). Temperature information received from the mode register 362 by the refresh counter update circuit 304 may include such a multi-bit value. The refresh counter update circuit 304 may determine refresh intervals ("example refresh interval") based on the multi-bit value.

To further illustrate, if the temperature measured (or recommended) at the first bank 104a corresponds to 100 degrees Celsius (° C.), the first temperature information 352a may indicate a multi-bit value of "11". In such examples, the refresh counter update circuit 304 may adjust a first value of the first counter associated with the first bank 104a to 1.9 microseconds (μs). As another example, if the temperature measured (or recommended) at the second bank 104b corresponds to 90° C., the second temperature information 352b may indicate a multi-bit value of "10". In such examples, the refresh counter update circuit 304 may adjust a second value of the second counter associated with the second bank 104b to 3.9 μs. It is noted that the example of Table 1 is illustrative and that other examples are also within the scope of the disclosure.

The per-bank refresh circuitry 212 may detect expiration of counters associated with the 3D memory device 102 and may issue refresh commands to the 3D memory device 102 based on detecting the expiration. For example, in accordance with expiration of the first counter ("bank 1 counter") based on the first value (e.g., 1.9 us or another value), the refresh request queue 330 may receive the first bank ID 354*a* (e.g., "bank 1 ID") from the memory 312. As another example, in accordance with expiration of the second counter ("bank 2 counter") based on the second value (e.g., 3.9 us or another value), the refresh request queue 330 may receive the second bank ID 354*b* (e.g., "bank 2 ID") from the memory 312.

The refresh request queue 330 may output refresh commands to 3D memory device 102. For example, the refresh request queue 330 may output a first refresh command 332*a* to the 3D memory device 102 in accordance with the first bank ID 354*a* reaching a particular position 340 within the refresh request queue 330. As another example, the refresh request queue 330 may output a second refresh command 332*b* to the 3D memory device 102 in accordance with the second bank ID 354*b* reaching the particular position 340 within the refresh request queue 330. In some examples, the particular position 340 may correspond to the "first" position in a first-in, first-out (FIFO) scheme.

The refresh bank control and row selection circuit 364 may receive refresh commands from the refresh request queue 330 and may initiate refresh operations at the 3D memory device 102 based on the refresh commands. For example, the refresh bank control and row selection circuit 364 may receive the first refresh command 332*a* from the refresh request queue 330 and may initiate a first refresh operation at the first bank 104*a* based on the first refresh command 332*a*. As another example, the refresh bank control and row selection circuit 364 may receive the second refresh command 332*b* from the refresh request queue 330 and may initiate a second refresh operation at the second bank 104*b* based on the second refresh command 332*b*. In some examples, the second refresh operation may occur after the first refresh operation.

In some implementations, refreshing a particular bank of a rank of the 3D memory device 102 may include masking (or "blocking") one or more other refresh operations to one or more other banks of the rank to enable refresh operations on a per-bank basis. To illustrate, executing the first refresh command 332*a* may include masking (or blocking) refresh operations at the banks 104*b-d*. As another example, executing the second refresh command 332*b* may include masking (or blocking) refresh operations at the banks 104*a* and 104*c-d*. Accordingly, different banks of the 3D memory device 102 may be associated with different refresh intervals.

To further illustrate some aspects of the disclosure, a temperature sensor in a bank (e.g., bank 0) may detect a temperature range and may adjust the corresponding bits of the mode register 362 to recommend a new temperature setting. The mode register 362, which may be included in a control unit of a memory chip, may store various memory settings (e.g., DRAM settings). The control unit may be responsible for memory operations, such as read operations, write operations, refresh requests, and other operations.

The mode register 362 may include N segments. In some examples, N may correspond to the quantity of banks of the 3D memory device 102. Further, each such segment may include, for example, two bits for each segment to indicate a temperature setting. Such a set of bits may correspond to temperature information, such as the temperature information 352*a-b*. A segment number may indicate the corresponding bank (e.g., via the bank IDs 354*a-b*). In some examples, the memory controller 202 may poll the mode register 362 on a periodic basis to retrieve such information from the mode register 362. Alternatively, or in addition, the memory controller 202 may receive such information from the mode register 362 upon occurrence of an event, such as an asynchronous event.

Upon reading temperature settings for a bank from the mode register 362, the memory controller 202 may cause the refresh counter update circuit 304 to update a value of the counter corresponding to the bank (e.g., at the LUT 316). Updating the value of the counter may adjust the refresh rate associated with the bank. In some implementations, the counter may be referred to as a tREFI counter. Further, according to the bank ID of the bank received from the control unit, the bank ID decoder 308 may enable the associated counter such that the counter is reset by the refresh counter update circuit 304. In some scenarios, different banks of the 3D memory device 102 may be associated with different temperatures, and the counters associated with the banks may represent different refresh rates.

The values of the counters may be decreased or adjusted (e.g., decremented) for each clock cycle. Upon expiration of a counter associated with a bank, a refresh signal and an ID of the bank may be sent to the refresh request queue 330 and may be forwarded to the control unit (or the mode register 362). The refresh bank control and row selection circuit 364 may select the bank and may select the bank (or row-group). Consequently, the memory controller 202 may enable more frequent refresh operations for banks with greater temperatures, while banks with lower temperatures may be refreshed based on a less frequent basis.

Figure 4:
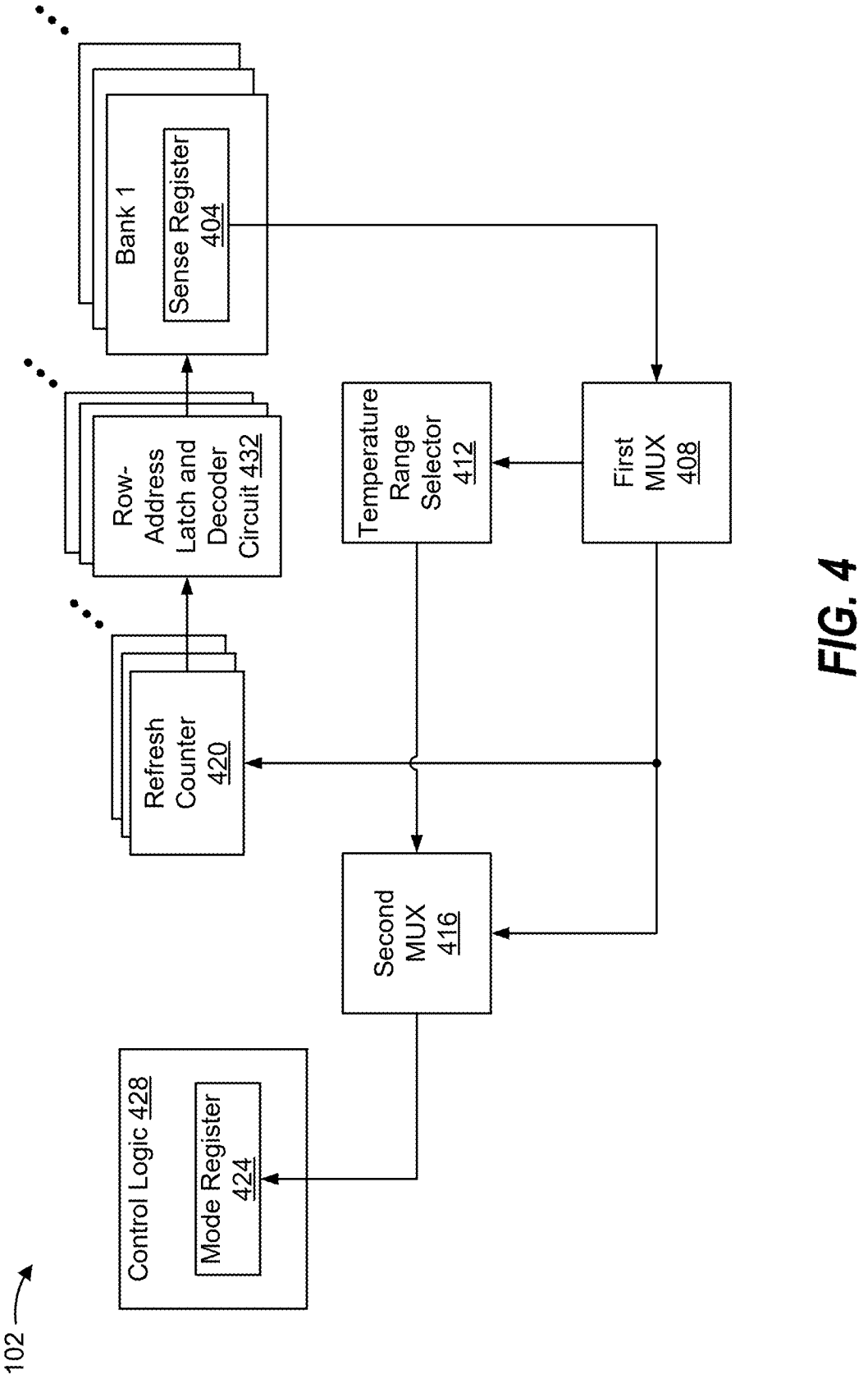
FIG. 4 illustrates an example of a 3D memory device that supports bank-based memory refresh operations.

FIG. 4 illustrates an example of a 3D memory device 102 that supports bank-based memory refresh operations. In the example of FIG. 4, banks of the 3D memory device 102 may each include a respective sense register, such as a representative sense register 404. The sense registers may be coupled to a first multiplexer (MUX) 408. The first MUX 408 may be coupled to a temperature range selector 412. The first MUX 408 may also be coupled to a second MUX 416 and to a plurality of refresh counters, such as a representative refresh counter 420. The temperature range selector 412 may be coupled to the second MUX 416, and the second MUX 416 may be coupled to a mode register 424 (e.g., the mode register 362 of FIG. 3). The mode register 424 may be included in control logic 428. The refresh counters may be coupled to row-address latch and decoder circuits, such as a representative row-address latch and decoder circuit 432. The row-address latch and decoder circuits may be coupled to the banks of the 3D memory device 102. Although the example of FIG. 4 may illustrate the refresh counters as being included in the 3D memory device 102, in some other examples, the refresh counters may be external to the 3D memory device 102, such as within the memory controller 202 of FIG. 2.

Further, the implementation illustrated in FIG. 4 may further include one or more other components omitted from FIG. 4 for clarity. For example, the 3D memory device 102 may include an address register, bank control logic, and a column-address counter/latch. A bus may be coupled to the address register, the bank control logic, and the column-address counter/latch. The bus may be further coupled to the refresh counters (such as the refresh counter 420). The column-address counter/latch and the bank control logic may be coupled to a column decoder, and the column decoder may be coupled to an input/output (I/O) gating circuit. In some examples, the I/O gating circuit may include read data latch write drivers. The I/O gating circuit may be coupled to the banks of the 3D memory device 102. The I/O gating circuit may also be coupled to a data output register and to a data input register. In some examples, the address register may be configured to receive address information from the memory controller 202, and the data output register and the data input register may be configured to output data to the memory controller 202 and to input data from the memory controller 202, respectively.

FIG. 5 is a flow diagram illustrating an example of a method 500 that supports bank-based memory refresh operations. In some examples, the method 500 may be performed by a memory controller, such as the memory controller 202 of FIG. 2. Alternatively, or in addition, the method 500 may be performed by another device, such as by the per-bank refresh circuitry 212.

The method 500 includes receiving, from a three-dimensional (3D) memory device, first temperature information associated with a first bank of the 3D memory device, at 502. For example, the memory controller 202 may receive, from the 3D memory device 102, the first temperature information 352a associated with the first bank 104a.

The method 500 further includes receiving, from the 3D memory device, second temperature information associated with a second bank of the 3D memory device, at 504. The first bank and the second bank are associated with a common rank of the 3D memory device. For example, the memory controller 202 may receive, from the 3D memory device 102, the second temperature information 352b associated with the second bank 104b. The first bank 104a and the second bank 104b may be associated with a common rank of the 3D memory device 102, such as the rank 108.

The method 500 further includes providing, to the 3D memory device, a first refresh command associated with the first bank, at 506. For example, the memory controller 202 may provide the first refresh command 332a associated with the first bank 104a to the 3D memory device 102.

The method 500 further includes providing, to the 3D memory device, a second refresh command associated with the second bank, at 508. The first refresh command is associated with a first refresh interval that is different than a second refresh interval associated with the second refresh command. For example, the memory controller 202 may provide the second refresh command 332b associated with the second bank 104b to the 3D memory device 102. The first refresh command 332a may be associated with a first refresh interval that is different than a second refresh interval associated with the second refresh command 332b.

One or more features described herein may improve performance associated with a memory device, such as the 3D memory device 102. For example, enabling individual refresh operations on a per-bank basis may enable improved temperature control of memory banks with greater temperature (such as memory banks closer to the controller tile 112) without involving excessive or unnecessary refresh operations to memory banks with lower temperatures (such as memory banks further from the controller tile 112). As a result, performance may be improved as compared to some "conservative" techniques (which may increase power consumption by increasing the refresh rate for memory banks with relatively low temperatures) and also as compared to some "aggressive" techniques (which may risk data loss by allowing greater temperatures at memory banks before increasing the refresh rate of the memory banks).

To further illustrate some aspects, in a first aspect, an apparatus includes a memory controller configured to receive, from a three-dimensional (3D) memory device, first temperature information associated with a first bank of the 3D memory device and to receive, from the 3D memory device, second temperature information associated with a second bank of the 3D memory device. The first bank and the second bank are associated with a common rank of the 3D memory device. The memory controller is further configured to provide, to the 3D memory device, a first refresh command associated with the first bank and to provide, to the 3D memory device, a second refresh command associated with the second bank. The first refresh command is associated with a first refresh interval that is different than a second refresh interval associated with the second refresh command.

In a second aspect, in combination with the first aspect, the first bank is associated with a first physical distance from the memory controller, the second bank is associated with a second physical distance from the memory controller, and the second physical distance is different than the first physical distance.

In a third aspect, in combination with one or more of the first aspect or the second aspect, the first physical distance is less than the second physical distance, and the first refresh interval is less than the second refresh interval.

In a fourth aspect, in combination with one or more of the first aspect through the third aspect, the memory controller is coupled to the first bank and to the second bank by a through-silicon via (TSV).

In a fifth aspect, in combination with one or more of the first aspect through the fourth aspect, the memory controller includes a bank identifier (ID) decoder configured to receive a first bank ID of the first bank and to receive a second bank ID of the second bank, a refresh counter update circuit configured to receive the first temperature information and to receive the second temperature information, and a counter stack coupled to the bank ID decoder and to the refresh counter update circuit.

In a sixth aspect, in combination with one or more of the first aspect through the fifth aspect, the bank ID decoder is further configured to select a first counter of the counter stack in accordance with the first bank ID and to select a second counter of the counter stack in accordance with the second bank ID.

In a seventh aspect, in combination with one or more of the first aspect through the sixth aspect, the refresh counter update circuit is further configured to adjust a first value of the first counter in accordance with the first temperature information and to adjust a second value of the second counter in accordance with the second temperature information.

In an eighth aspect, in combination with one or more of the first aspect through the seventh aspect, the memory controller further includes a refresh request queue configured to receive the first bank ID from the counter stack in accordance with expiration of the first counter based on the first value and to receive the second bank ID from the counter stack in accordance with expiration of the second counter based on the second value.

In a ninth aspect, in combination with one or more of the first aspect through the eighth aspect, the memory controller is further configured to output the first refresh command to the 3D memory device in accordance with the first bank ID reaching a particular position within the refresh request queue and to output the second refresh command to the 3D memory device in accordance with the second bank ID reaching the particular position within the refresh request queue.

In a tenth aspect, a method of operation of a memory controller includes receiving, from a three-dimensional (3D) memory device, first temperature information associated with a first bank of the 3D memory device and further includes receiving, from the 3D memory device, second temperature information associated with a second bank of the 3D memory device. The first bank and the second bank are associated with a common rank of the 3D memory device. The method further includes providing, to the 3D memory device, a first refresh command associated with the first bank and also includes providing, to the 3D memory device, a second refresh command associated with the second bank. The first refresh command is associated with a first refresh interval that is different than a second refresh interval associated with the second refresh command.

In an eleventh aspect, in combination with the tenth aspect, the first bank is associated with a first physical distance from the memory controller, the second bank is associated with a second physical distance from the memory controller, and the second physical distance is different than the first physical distance.

In a twelfth aspect, in combination with one or more of the tenth aspect through the eleventh aspect, the first physical distance is less than the second physical distance, and the first refresh interval is less than the second refresh interval.

In a thirteenth aspect, in combination with one or more of the tenth aspect through the twelfth aspect, the method further includes receiving, at a bank identifier (ID) decoder, a first bank ID of the first bank and a second bank ID of the second bank and receiving, at a refresh counter update circuit, the first temperature information and the second temperature information.

In a fourteenth aspect, in combination with one or more of the tenth aspect through the thirteenth aspect, the method further includes selecting, by the bank ID decoder, a first counter of a counter stack in accordance with the first bank ID and selecting, by the bank ID decoder, a second counter of the counter stack in accordance with the second bank ID.

In a fifteenth aspect, in combination with one or more of the tenth aspect through the fourteenth aspect, the method further includes adjusting, by the refresh counter update circuit, a first value of the first counter in accordance with the first temperature information and adjusting, by the refresh counter update circuit, a second value of the second counter in accordance with the second temperature information.

In a sixteenth aspect, in combination with one or more of the tenth aspect through the fifteenth aspect, the method further includes receiving, at a refresh request queue, the first bank ID from the counter stack in accordance with expiration of the first counter based on the first value and receiving, at a refresh request queue, the second bank ID from the counter stack in accordance with expiration of the second counter based on the second value.

In a seventeenth aspect, in combination with one or more of the tenth aspect through the sixteenth aspect, the method further includes outputting the first refresh command to the 3D memory device in accordance with the first bank ID reaching a particular position within the refresh request queue and outputting the second refresh command to the 3D memory device in accordance with the second bank ID reaching the particular position within the refresh request queue.

In an eighteenth aspect, a non-transitory computer-readable medium stores instructions executable by one or more processors of a memory controller to initiate, perform, or control operations. The operations include receiving, from a three-dimensional (3D) memory device, first temperature information associated with a first bank of the 3D memory device and receiving, from the 3D memory device, second temperature information associated with a second bank of the 3D memory device. The first bank and the second bank are associated with a common rank of the 3D memory device. The operations further include providing, to the 3D memory device, a first refresh command associated with the first bank and providing, to the 3D memory device, a second refresh command associated with the second bank. The first refresh command is associated with a first refresh interval that is different than a second refresh interval associated with the second refresh command.

In a nineteenth aspect, in combination with the eighteenth aspect, the first bank is associated with a first physical distance from the memory controller, the second bank is associated with a second physical distance from the memory controller, and the second physical distance is different than the first physical distance.

In a twentieth aspect, in combination with one or more of the eighteenth aspect through the nineteenth aspect, the first physical distance is less than the second physical distance, and the first refresh interval is less than the second refresh interval.

In the figures, a single block may be described as performing a function or functions. The function or functions performed by a block may be performed in a single component or across multiple components, and/or may be performed using hardware, software, or a combination of hardware and software. To illustrate, various illustrative components, blocks, modules, circuits, and operations may be described in terms of functionality. Whether such functionality is implemented as hardware or software may depend upon the particular application and design of the overall system. Skilled artisans may implement the described functionality in varying ways for each particular application, but such implementation decisions should not be interpreted as causing a departure from the scope of the present disclosure. Also, the example devices may include components other than those shown, including components such as a processor, memory, and the like.

As used herein, the term "determine" or "determining" encompasses a wide variety of actions and, therefore, "determining" can include calculating, computing, processing, deriving, estimating, investigating, looking up (such as via looking up in a table, a database, or another data structure), inferring, ascertaining, or measuring, among other possibilities. Also, "determining" can include receiving (such as receiving information), accessing (such as accessing data stored in memory) or transmitting (such as transmitting information), among other possibilities. Additionally, "determining" can include resolving, selecting, obtaining, choosing, establishing and other such similar actions.

The terms "device" and "apparatus" are not limited to one or a specific number of physical objects (such as one smartphone, one camera controller, one processing system, and so on). As used herein, a device may be any electronic device with one or more parts that may implement at least some portions of the disclosure. While the description and examples herein use the term "device" to describe various aspects of the disclosure, the term "device" is not limited to a specific configuration, type, or number of objects. As used herein, an apparatus may include a device or a portion of the device for performing the described operations.

Certain components in a device or apparatus described as "means for accessing," "means for receiving," "means for sending," "means for using," "means for selecting," "means for determining," "means for normalizing," "means for multiplying," or other similarly-named terms referring to one or more operations on data, such as image data, may refer to processing circuitry (such as application specific integrated circuits (ASICs), digital signal processors (DSP), graphics processing unit (GPU), central processing unit (CPU), computer vision processor (CVP), or neural signal processor (NSP)) configured to perform the recited function through hardware, software, or a combination of hardware configured by software.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to the Figures referenced above include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, application, software applications, software packages, routines, subroutines, objects, executables, threads of execution, procedures, and/or functions, among other examples, whether referred to as software, firmware, middleware, microcode, hardware description language or otherwise. In addition, features discussed herein may be implemented via specialized processor circuitry, via executable instructions, or combinations thereof.

In one or more aspects, the operations described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, which is one or more modules of computer program instructions, encoded on a computer storage media for execution by, or to control the operation of, data processing apparatus.

The operations of a method or algorithm disclosed herein may be implemented in a processor-executable software module which may reside on a computer-readable medium and commercially made available as a computer program product as software. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc, where disks usually reproduce data magnetically and discs reproduce data optically with lasers. Combinations of the above should also be included within the scope of computer-readable media.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein but are to be accorded the widest scope consistent with this disclosure, the principles and the novel features disclosed herein.

Additionally, a person having ordinary skill in the art will readily appreciate, opposing terms such as "upper" and "lower," or "front" and back," or "top" and "bottom," or "forward" and "backward," or "left" and "right" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown, or in sequential order, or that all illustrated operations be performed to achieve desirable results. Further, the drawings may schematically depict one or more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof.

As used herein, "based on" is intended to be interpreted in the inclusive sense, unless otherwise explicitly indicated. For example, "based on" may be used interchangeably with "based at least in part on," "associated with," "in association with," or "in accordance with" unless otherwise explicitly indicated. Specifically, unless a phrase refers to "based on only 'a,'" or the equivalent in context, whatever it is that is "based on 'a,'" or "based at least in part on 'a,'" may be based on "a" alone or based on a combination of "a" and one or more other factors, conditions, or information.

The term "substantially" is defined as largely, but not necessarily wholly, what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 5, 5, or 50 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
a memory controller configured to:
    receive, from a three-dimensional (3D) memory device, first temperature information associated with a first bank of the 3D memory device;
    receive, from the 3D memory device, second temperature information associated with a second bank of the 3D memory device, wherein the first bank and the second bank are associated with a common rank of the 3D memory device;
    provide, to the 3D memory device, a first refresh command associated with the first bank; and
    provide, to the 3D memory device, a second refresh command associated with the second bank,
    wherein the first refresh command is associated with a first refresh interval that is different than a second refresh interval associated with the second refresh command, and wherein the memory controller includes:
    a bank identifier (ID) decoder configured to receive a first bank ID of the first bank and to receive a second bank ID of the second bank;
    a refresh counter update circuit configured to receive the first temperature information and to receive the second temperature information; and
        a counter stack coupled to the bank ID decoder and to the refresh counter update circuit.

2. The apparatus of claim 1, wherein the first bank is associated with a first physical distance from the memory controller, wherein the second bank is associated with a second physical distance from the memory controller, and wherein the second physical distance is different than the first physical distance.

3. The apparatus of claim 2, wherein the first physical distance is less than the second physical distance, and wherein the first refresh interval is less than the second refresh interval.

4. The apparatus of claim 1, wherein the memory controller is coupled to the first bank and to the second bank by a through-silicon via (TSV).

5. The apparatus of claim 1, wherein the bank ID decoder is further configured to select a first counter of the counter stack in accordance with the first bank ID and to select a second counter of the counter stack in accordance with the second bank ID.

6. The apparatus of claim 5, wherein the refresh counter update circuit is further configured to adjust a first value of the first counter in accordance with the first temperature information and to adjust a second value of the second counter in accordance with the second temperature information.

7. The apparatus of claim 6, wherein the memory controller further includes a refresh request queue configured to:
    receive the first bank ID from the counter stack in accordance with expiration of the first counter based on the first value; and
    receive the second bank ID from the counter stack in accordance with expiration of the second counter based on the second value.

8. The apparatus of claim 7, wherein the memory controller is further configured to:
    output the first refresh command to the 3D memory device in accordance with the first bank ID reaching a particular position within the refresh request queue; and
    output the second refresh command to the 3D memory device in accordance with the second bank ID reaching the particular position within the refresh request queue.

9. A method of operation of a memory controller, the method comprising:
    receiving, from a three-dimensional (3D) memory device, first temperature information associated with a first bank of the 3D memory device;
    receiving, from the 3D memory device, second temperature information associated with a second bank of the 3D memory device, wherein the first bank and the second bank are associated with a common rank of the 3D memory device;
    providing, to the 3D memory device, a first refresh command associated with the first bank;
    providing, to the 3D memory device, a second refresh command associated with the second bank, wherein the first refresh command is associated with a first refresh interval that is different than a second refresh interval associated with the second refresh command;
    receiving, at a bank identifier (ID) decoder, a first bank ID of the first bank and a second bank ID of the second bank; and
    receiving, at a refresh counter update circuit, the first temperature information and the second temperature information.

10. The method of claim 9, wherein the first bank is associated with a first physical distance from the memory controller, wherein the second bank is associated with a second physical distance from the memory controller, and wherein the second physical distance is different than the first physical distance.

11. The method of claim 10, wherein the first physical distance is less than the second physical distance, and wherein the first refresh interval is less than the second refresh interval.

12. The method of claim 9, further comprising:
    selecting, by the bank ID decoder, a first counter of a counter stack in accordance with the first bank ID; and
    selecting, by the bank ID decoder, a second counter of the counter stack in accordance with the second bank ID.

13. The method of claim 12, further comprising:
    adjusting, by the refresh counter update circuit, a first value of the first counter in accordance with the first temperature information; and adjusting, by the refresh counter update circuit, a second value of the second counter in accordance with the second temperature information.

14. The method of claim 13, further comprising:

receiving, at a refresh request queue, the first bank ID from the counter stack in accordance with expiration of the first counter based on the first value; and receiving, at a refresh request queue, the second bank ID from the counter stack in accordance with expiration of the second counter based on the second value.

15. The method of claim 14, further comprising:

outputting the first refresh command to the 3D memory device in accordance with the first bank ID reaching a particular position within the refresh request queue; and outputting the second refresh command to the 3D memory device in accordance with the second bank ID reaching the particular position within the refresh request queue.

16. A non-transitory computer-readable medium storing instructions executable by one or more processors of a memory controller to initiate, perform, or control operations, the operations comprising:

receiving, from a three-dimensional (3D) memory device, first temperature information associated with a first bank of the 3D memory device;

receiving, from the 3D memory device, second temperature information associated with a second bank of the 3D memory device, wherein the first bank and the second bank are associated with a common rank of the 3D memory device;

providing, to the 3D memory device, a first refresh command associated with the first bank;

providing, to the 3D memory device, a second refresh command associated with the second bank, wherein the first refresh command is associated with a first refresh interval that is different than a second refresh interval associated with the second refresh command;

receiving, at a bank identifier (ID) decoder, a first bank ID of the first bank and a second bank ID of the second bank; and receiving, at a refresh counter update circuit, the first temperature information and the second temperature information.

17. The non-transitory computer-readable medium of claim 16, wherein the first bank is associated with a first physical distance from the memory controller, wherein the second bank is associated with a second physical distance from the memory controller, and wherein the second physical distance is different than the first physical distance.

18. The non-transitory computer-readable medium of claim 17, wherein the first physical distance is less than the second physical distance, and wherein the first refresh interval is less than the second refresh interval.

* * * * *